(12) United States Patent
Lee et al.

(10) Patent No.: US 10,655,801 B2
(45) Date of Patent: May 19, 2020

(54) LIGHT EMITTING DEVICE AND VEHICULAR LAMP COMPRISING SAME

(71) Applicant: Seoul Semiconductor Co., Ltd., Ansan-si (KR)

(72) Inventors: Yoon Seop Lee, Ansan-si (KR); Da Hye Kim, Ansan-si (KR); Sang Hong Lee, Ansan-si (KR); Byoung Kyu Park, Ansan-si (KR); Dae Wook Kim, Ansan-si (KR); Jae Hyun Park, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/443,032

(22) Filed: Jun. 17, 2019

(65) Prior Publication Data

US 2019/0309916 A1 Oct. 10, 2019

Related U.S. Application Data

(63) Continuation of application No. 15/528,023, filed as application No. PCT/KR2015/012428 on Nov. 18, 2015, now Pat. No. 10,323,803.

(30) Foreign Application Priority Data

Nov. 18, 2014 (KR) .......................... 10-2014-0161071
Nov. 18, 2014 (KR) .......................... 10-2014-0161072

(51) Int. Cl.
*F21S 2/00* (2016.01)
*F21S 10/02* (2006.01)
(Continued)

(52) U.S. Cl.
CPC .................. *F21S 2/005* (2013.01); *F21S 2/00* (2013.01); *F21S 10/02* (2013.01); *F21S 43/00* (2018.01);
(Continued)

(58) Field of Classification Search
None
See application file for complete search history.

(56) References Cited

U.S. PATENT DOCUMENTS 8,366,304 B2 2/2013 Geoffroy et al.
8,384,105 B2 * 2/2013 Tetz ...................... H01L 33/507
257/98

(Continued)

FOREIGN PATENT DOCUMENTS

| CN | 103542380 | 1/2014 |
| WO | 2014/095895 | 6/2014 |
| WO | 2014/157905 | 10/2014 |

OTHER PUBLICATIONS

International Search Report dated Mar. 4, 2016, in PCT/KR2015/012428 (with English Translation).

(Continued)

*Primary Examiner* — Crystal L Hammond
(74) *Attorney, Agent, or Firm* — H.C. Park & Associates, PLC (57) ABSTRACT

A light emitting device and a vehicular lamp are provided. The light emitting device comprises: a first light emitting unit; a second light emitting unit separated from the first light emitting unit; and a sidewall surrounding side surfaces of the first and second light emitting units while adjoining the side surfaces of the first and second light emitting units, wherein the first light emitting unit and the second light emitting unit emit light have different peak wavelengths.

20 Claims, 8 Drawing Sheets

(51) Int. Cl.
  *H01L 33/50* (2010.01)
  *F21S 43/00* (2018.01)
  *H01L 25/075* (2006.01)
  *H01L 33/48* (2010.01)
  *F21S 43/14* (2018.01)
  *F21S 43/30* (2018.01)

(52) U.S. Cl.
  CPC ............... *F21S 43/14* (2018.01); *F21S 43/30* (2018.01); *H01L 25/0753* (2013.01); *H01L 33/48* (2013.01); *H01L 33/50* (2013.01); *H01L 33/504* (2013.01)

(56) References Cited

U.S. PATENT DOCUMENTS

| | | | |
|---|---|---|---|
| 9,308,858 B2 | 4/2016 | Cho et al. | |
| 9,835,303 B2 | 12/2017 | Herrmann et al. | |
| 2007/0195524 A1* | 8/2007 | Seo | G02B 6/0021 362/228 |
| 2009/0272996 A1* | 11/2009 | Chakraborty | H01L 33/501 257/98 |
| 2009/0278142 A1* | 11/2009 | Watanabe | H01L 21/6835 257/89 |
| 2011/0050088 A1* | 3/2011 | Park | H01J 1/74 313/496 |
| 2011/0085344 A1* | 4/2011 | Koizumi | B60Q 1/0041 362/516 |
| 2011/0175117 A1 | 7/2011 | Jagt et al. | |
| 2011/0233601 A1 | 9/2011 | Nakayama | |
| 2011/0248296 A1* | 10/2011 | Choi | H01L 33/504 257/89 |
| 2011/0316017 A1 | 12/2011 | Liu et al. | |
| 2012/0097996 A1 | 4/2012 | Lee et al. | |
| 2012/0161167 A1 | 6/2012 | Yamazaki | |
| 2012/0211781 A1* | 8/2012 | Lee | C09K 11/7734 257/89 |
| 2013/0087823 A1 | 4/2013 | Tsai et al. | |
| 2013/0265757 A1 | 10/2013 | Tanaka et al. | |
| 2013/0329440 A1 | 12/2013 | Tsutsumi et al. | |
| 2014/0034901 A1 | 2/2014 | Moon | |
| 2014/0042470 A1* | 2/2014 | Hsu | H01L 33/505 257/98 |
| 2014/0078763 A1 | 3/2014 | Park et al. | |
| 2014/0124801 A1 | 5/2014 | Lee | |
| 2014/0140082 A1 | 5/2014 | Kuboyama et al. | |
| 2014/0145161 A1* | 5/2014 | Naijo | H01L 51/0097 257/40 |
| 2014/0175472 A1 | 6/2014 | An | |
| 2014/0204609 A1* | 7/2014 | Shin | G02B 6/0031 362/609 |
| 2014/0339584 A1 | 11/2014 | Kim et al. | |
| 2014/0362565 A1 | 12/2014 | Yao et al. | |
| 2015/0062949 A1 | 3/2015 | Lee et al. | |
| 2015/0077051 A1 | 3/2015 | Kim et al. | |
| 2015/0345581 A1 | 12/2015 | Shin et al. | |
| 2016/0056345 A1 | 2/2016 | Park et al. | |
| 2017/0162746 A1 | 6/2017 | Cha et al. | |
| 2017/0365743 A1 | 12/2017 | You et al. | |
| 2018/0103513 A1 | 4/2018 | Tseng et al. | |

OTHER PUBLICATIONS

Written Opinion dated Mar. 4, 2016, in PCT/KR2015/012428 (with English Translation).
The First Office Action dated Aug. 3, 2018, issued in Chinese Patent Application No. 201580062657.3.
Extended European Search Report dated Aug. 14, 2018, issued in European Patent Application No. 15861575.
Non-Final Office Action dated Sep. 21, 2018, issued in U.S. Appl. No. 15/528,023.
Notice of Allowance dated Apr. 5, 2019, issued in U.S. Appl. No. 15/528,023.
Notice of Allowance dated Jan. 17, 2019, issued in U.S. Appl. No. 16/116,354.
European Office Action dated Jan. 3, 2020, issued in European Patent Application No. 15861575.7.

* cited by examiner

LIGHT EMITTING DEVICE AND VEHICULAR LAMP COMPRISING SAME

CROSS-REFERENCE TO RELATED APPLICATIONS

This application is a Continuation of U.S. patent application Ser. No. 15/528,023, filed on May 18, 2017, issued as U.S. Pat. No. 10,323,803 on Jun. 18, 2019, which is the National Stage Entry of International Patent Application No. PCT/KR2015/012428, filed on Nov. 18, 2015, and claims priority from and the benefit of Korean Patent Application No. 10-2014-0161071, filed on Nov. 18, 2014, and Korean Patent Application No. 10-2014-0161072, filed on Nov. 18, 2014, each of which are incorporated by reference for all purposes as if fully set forth herein.

BACKGROUND

Field

Exemplary embodiments of the present disclosure relate to a light emitting device and a vehicular lamp including the same, and, particularly, to a light emitting device configured to emit light of at least two wavelengths and a vehicular lamp including the same.

Discussion of the Background

A light emitting diode refers to an inorganic semiconductor device that emits light through recombination of electrons and holes, and has recently been used in various fields including displays, automobile lamps, general lighting, and the like. Such a light emitting diode has various advantages such as long lifespan, low power consumption, and rapid response, and a light emitting device using such a light emitting diode is expected to replace typical light sources.

Since such a light emitting diode emits light having a relatively narrow full width at half-maximum, a typical light emitting diode generally emits monochromatic light. Accordingly, in order to allow one light emitting module or light emitting device to emit various colors as needed, light emitting diode packages configured to emit light of different colors must be mounted in a single module.

SUMMARY

Exemplary embodiments of the present disclosure provide a light emitting device including at least two light emitting portions.

Exemplary embodiments of the present disclosure provide a vehicular lamp which includes a combination lamp capable of performing a plurality of functions by allowing one light emitting device to emit light having at least two colors.

Exemplary embodiments of the present disclosure provide a light emitting device having high heat dissipation efficiency and reliability.

In accordance with one aspect of the present disclosure, a light emitting device includes: a first light emitting unit; a second light emitting unit separated from the first light emitting unit; and a sidewall surrounding side surfaces of the first and second light emitting units while adjoining the side surfaces of the first and second light emitting units, wherein the first light emitting unit and the second light emitting unit emit light having different peak wavelengths.

The light emitting device may further include a substrate, wherein the first and second light emitting units and the sidewall may be placed on the substrate.

The substrate may include first to fourth electrodes, in which the first and second electrodes may be electrically connected to the first light emitting unit and the third and fourth electrodes may be electrically connected to the second light emitting unit.

The first to fourth electrodes may be insulated from each other and each of the first to fourth electrodes may be exposed to an outer surface of the substrate.

The substrate may include aluminum nitride (AlN).

The first light emitting unit may include a first light emitting diode and a first wavelength converter disposed on the first light emitting diode, and the second light emitting unit may include a second light emitting diode and a second wavelength converter disposed on the second light emitting diode.

The first wavelength converter may further cover a side surface of the first light emitting diode, and the second wavelength converter may further cover a side surface of the second light emitting diode.

Each of the first and second light emitting diodes may include pad electrodes disposed on a lower surface thereof.

The sidewall may surround part of the lower surface of each of the first and second light emitting diodes and side surfaces of the pad electrodes.

Each of the first and second light emitting units may be formed in plural.

The first light emitting unit may emit white light and the second light emitting unit may emit amber light.

The sidewall may include a light reflective material.

A side surface of the sidewall may be flush with a side surface of the substrate.

An upper surface of the sidewall may be flush with an upper surface of each of the first and second light emitting units.

A thickness of a portion of the sidewall filling a separation region between the first light emitting unit and the second light emitting unit may be smaller than the thickness of a portion of the sidewall corresponding to the shortest distance from an outer peripheral surface of the sidewall to a side surface of one of the first and second light emitting units.

In accordance with another aspect of the present disclosure, a vehicular lamp includes: a combination lamp emitting light of at least two colors and providing at least two functions, in which the combination lamp includes: a light emitting device including a first light emitting unit, a second light emitting unit separated from the first light emitting unit, and a sidewall surrounding the first and second light emitting unit while adjoining side surfaces of the first and second light emitting unit, wherein the first light emitting unit and the second light emitting unit emit light having different peak wavelengths, and wherein the combination lamp provides different functions upon operation of the first light emitting unit than upon operation of the second light emitting unit.

The first light emitting unit may emit light when the combination lamp acts as a daytime running light (DRL) and the second light emitting unit may emit light when the combination lamp acts as a turn signal light.

The first light emitting unit may emit white light and the second light emitting unit may emit amber light.

The light emitting device may further include a substrate, and the first and second light emitting units and the sidewall may be placed on the substrate.

The vehicular lamp may further include a controller controlling the light emitting device.

In accordance with a further aspect of the present disclosure, a light emitting device includes: a substrate; a first light emitting unit disposed on the substrate and including a first light emitting diode and a first wavelength converter disposed on the first light emitting diode; a second light emitting unit disposed on the substrate to be separated from the first light emitting unit and including a second light emitting diode and a second wavelength converter disposed on the second light emitting diode; a first bonding layer interposed between the first light emitting unit and the substrate; a second bonding layer interposed between the second light emitting unit and the substrate; and a sidewall surrounding side surfaces of the first and second light emitting units while adjoining the side surfaces of the first and second light emitting units, wherein the first light emitting unit and the second light emitting unit emit light having different peak wavelengths and each of the first and second bonding layers includes a metal sintered body including metal particles.

The metal particles may include silver (Ag) particles.

The substrate may include first to fourth electrodes, in which the first and second electrodes may be electrically connected to the first light emitting unit and the third and fourth electrodes may be electrically connected to the second light emitting unit.

The first to fourth electrodes may be insulated from each other and each of the first to fourth electrodes may be exposed to an outer surface of the substrate.

The first light emitting unit may emit white light.

The second light emitting unit may emit amber light.

Each of the first and second light emitting diodes may include pad electrodes disposed on a lower surface thereof.

The first bonding layer may cover lower surfaces and at least some side surfaces of the pad electrodes disposed under the first light emitting diode, and the second bonding layer may cover lower surfaces and at least some side surfaces of the pad electrodes disposed under the second light emitting diode.

Some side surfaces of the first bonding layer may be flush with side surfaces of the first light emitting diode and some side surfaces of the second bonding layer may be flush with side surfaces of the second light emitting diode.

The pad electrodes of each of the first and second light emitting diodes may include a first electrode pad and a second electrode pad, each of the first and second pad electrodes may include a side surface facing the other pad electrode, and each of the first and second bonding layers may include a first bonding layer and a second bonding layer.

One side surface of the first bonding layer may be flush with the side surface of the first pad electrode facing the second pad electrode, and one side surface of the second bonding layer may be flush with the side surface of the second pad electrode facing the first pad electrode.

The first bonding layer may cover side surfaces of the first pad electrode excluding the side surface of the first pad electrode facing the second pad electrode and other side surfaces of the first bonding layer may be flush with side surfaces of the light emitting diode; and the second bonding layer may cover side surfaces of the second pad electrode excluding the side surface of the second pad electrode facing the first pad electrode and other side surfaces of the second bonding layer may be flush with the side surfaces of the light emitting diode.

The first and second bonding layers may have a thickness of 10 µm to 30 µm.

Exemplary embodiments of the present disclosure provide a light emitting device configured to selectively emit light of different colors, as needed, thereby simplifying the manufacturing process through omission of separate manufacture of two or more light emitting devices configured to emit different colors.

In addition, the light emitting device according to the exemplary embodiments of the present disclosure can be applied to a vehicular lamp, thereby simplifying a process of manufacturing a combination lamp capable of performing a plurality of functions while reducing failure.

Exemplary embodiments of the present disclosure also provide a light emitting device that includes a bonding layer including a sintered body of metal particles to secure good heat dissipation while preventing short circuit, thereby providing high reliability.

DETAILED DESCRIPTION

In manufacture of a light emitting module or a light emitting device configured to emit light of two or more colors, a process of mounting light emitting diode packages configured to emit different colors must be performed at least twice. Increase in the number of processes means reduction in production yield of the light emitting module or the light emitting device. Moreover, increase in the number of light emitting diode packages mounted on the light emitting module or the light emitting device inevitably increases the volume of the light emitting module or the light emitting device.

Furthermore, in order to improve luminous intensity of the light emitting module or the light emitting device, at least three light emitting diode packages are required, and when there is a difference in luminous characteristics between the light emitting diode packages, color deviation occurs between manufactured light emitting modules. Moreover, spatial restriction limits the number of light emitting diode packages to be mounted on the light emitting module or the light emitting device, thereby making it difficult to manufacture a light emitting module or a light emitting device providing sufficient intensity of light.

Furthermore, in order to mount a flip-chip type light emitting diode on a separate substrate, there is a need for a process of bonding the light emitting diode to the substrate via an electrically conductive material. In the related art, conductive paste bonding, eutectic bonding, or Au bump ball bonding is used as a method of bonding the flip-chip type light emitting diode to the substrate.

In the bonding method using conductive pastes, conductive pastes spread due to viscosity thereof during the bonding process, whereby an n-electrode and a p-electrode are electrically connected to each other, causing short circuit of the light emitting diode. In addition, eutectic bonding can cause deterioration in reliability due to generation of pores in a structure bonded by eutectic bonding. Moreover, Au bump ball bonding has problems of low heat dissipation efficiency and mechanical reliability due to a relatively small contact area.

Hereinafter, exemplary embodiments of the present disclosure will be described in detail with reference to the accompanying drawings. It should be understood that the present disclosure is not limited to the following embodiments and may be embodied in different ways, and that the embodiments are provided for complete disclosure and thorough understanding of the present disclosure by those skilled in the art. In addition, it should be noted that the drawings are not to precise scale and may be exaggerated in thickness of lines or size of components for descriptive convenience and clarity only. It will be understood that when an element such as a layer, film, region or substrate is referred to as being placed "above"/"below" or "on"/"under" another element, it can be directly placed on the other element, or intervening layer(s) may also be present. Further, like components will be denoted by like reference numerals throughout the specification and the accompanying drawings.

Figure 4:
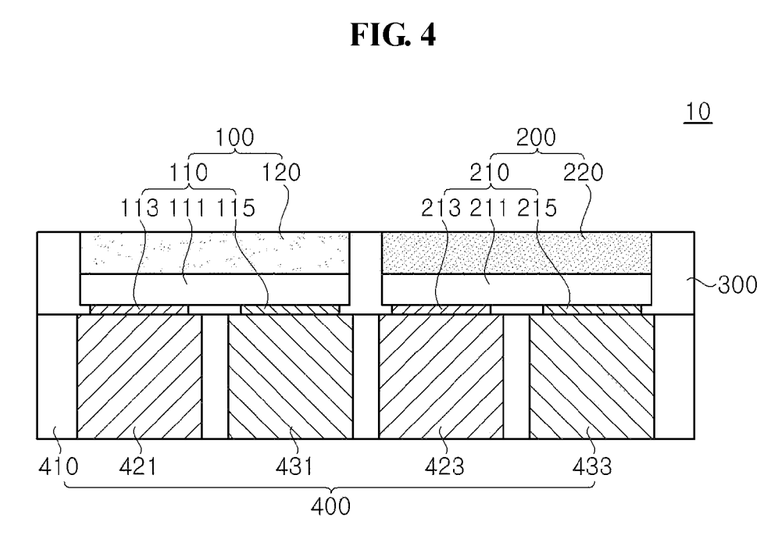
FIG. 4 is a cross-sectional view of the light emitting device according to the exemplary embodiment of the present disclosure.

FIG. 1 to FIG. 4 are a perspective view, a top view, a bottom view and a cross-sectional view of a light emitting device according to one exemplary embodiment of the present disclosure, respectively. In particular, FIG. 4 is a cross-sectional view taken along line A-A of FIG. 1 to FIG. 3.

Referring to FIG. 1 to FIG. 4, a light emitting device 10 may include at least two light emitting portions. Specifically, the light emitting device 10 includes a first light emitting unit 100, a second light emitting unit 200, and a sidewall 300. In addition, the light emitting device 10 may further include a substrate 400 and a protection element 310.

The substrate 400 may be placed on the bottom of the light emitting device 10 and serves to support the first and second light emitting units 100, 200 and the sidewall 300. The substrate 400 may be an insulating or conductive substrate, or may be a printed circuit board (PDB) having a conductive pattern formed thereon. When the substrate 400 is an insulating substrate, the substrate 400 may include a polymer material or a ceramic material, for example, a ceramic material having good thermal conductivity, such as Aluminum Nitride (AlN).

The substrate 400 may include a base 410 and may further include first to fourth electrodes 421, 431, 423, 433. Here, the base 410 may serve to support the entirety of the substrate 400 and the electrodes 421, 431, 423, 433, and may include an insulating material in order to insulate the electrodes 421, 431, 423, 433 from one another. For example, the base 410 may be formed of a ceramic material having good thermal conductivity, such as AlN.

The first to fourth electrodes 421, 431, 423, 433 may be insulated from one another and may be vertically formed through the base 410 to be exposed to upper and lower surfaces of the base 410. With this structure, the electrodes 421, 431, 423, 433 may be electrically connected to the first and second light emitting units 100, 200 disposed on the substrate 400 and may also be electrically connected to an external power source through the lower surface of the substrate 400 to supply electric power to the first and second light emitting units 100, 200.

However, it should be understood that other implementations are also possible and the shapes of the first to fourth electrodes 421, 431, 423, 433 may be changed in various ways. For example, at least one of the first to fourth electrodes 421, 431, 423, 433 may be exposed through a side surface of the base 410 and at least some of the first to fourth electrodes 421, 431, 423, 433 may be electrically connected to each other. Further, the light emitting device 10 may include five or more electrodes depending upon the number of light emitting portions in the light emitting device 10. An electrical connection structure between the light emitting portions 100, 200 and the electrodes will be described in detail below.

In some exemplary embodiments, the substrate 400 may be omitted.

Referring again to FIG. 1 to FIG. 4, the light emitting device 10 may include at least two light emitting portions, for example, the first light emitting unit 100 and the second light emitting unit 200 as in this exemplary embodiment. The first light emitting unit 100 and the second light emitting unit 200 may be placed on the substrate 400.

The first light emitting unit 100 may include a first light emitting diode 110 and a first wavelength converter 120. The first light emitting diode 110 may include a light emitting structure 111, a first pad electrode 113 and a second pad electrode 115. The first light emitting unit 100 may be configured to emit light in a different wavelength band than the second light emitting unit 200. For example, the first light emitting unit 100 may be configured to emit white light.

The light emitting structure 111 may include an n-type semiconductor layer, a p-type semiconductor layer, and an active layer interposed between the n-type semiconductor layer and the p-type semiconductor layer, whereby the first light emitting diode 110 can emit light upon application of power thereto. The first pad electrode 113 and the second pad electrode 115 may be electrically connected to the n-type semiconductor layer and the p-type semiconductor layer (or vice versa). Particularly, the first pad electrode 113 and the second pad electrode 115 may extend downwards from the light emitting structure 111 and thus may be placed at a lower side of the first light emitting diode 110. Alternatively, the first and second pad electrodes 113, 115 may be generally flush with a lower surface of the light emitting structure 111. Alternatively, the first and second pad electrodes 113, 115 may be placed higher than the lower surface of the light emitting structure 111. In this embodiment, the lower surface of the light emitting structure 111 may be formed with grooves, and the first and second pad electrodes 113, 115 may be exposed to the grooves. The first light emitting diode 110 is not limited to a particular structure, and may be, for example, a flip-chip type semiconductor light emitting diode in which the first pad electrode 113 and the second pad electrode 115 are placed on one surface of the light emitting structure 111.

The first and second pad electrodes 113, 115 may be electrically connected to a first electrode 421 and a second electrode 431 of the substrate 400, respectively. Accordingly, electric power can be supplied to the first light emitting diode 110 through the first and second electrodes 421, 431.

The first wavelength converter 120 may be disposed on the first light emitting diode 110 and may cover at least part of an upper surface of the first light emitting diode 110. In addition, the first wavelength converter 120 may be formed substantially in the same area as the upper surface of the first light emitting diode 110, whereby a side surface of the first light emitting diode 110 may be coplanar with a side surface of the first wavelength converter 120.

The first wavelength converter 120 may include phosphors and a supporter containing the phosphors. The first wavelength converter 120 may include various kinds of phosphors well-known to those skilled in the art, for example, garnet type phosphors, aluminate phosphors, sulfide phosphors, oxynitride phosphors, nitride phosphors, fluoride phosphors, and silicate phosphors, and the like, and may be configured to allow the first light emitting diode 110 to emit white light through wavelength conversion of light emitted from the first light emitting unit 100. For example, when the first light emitting diode 110 emits light having a peak wavelength in the blue wavelength band, the first wavelength converter 120 may include phosphors that emit light (for example, green light, red light or yellow light) having a longer peak wavelength than blue light. In addition, when the first light emitting diode 110 emits light having a peak wavelength in the UV wavelength band, the first wavelength converter 120 may include phosphors that emit light (for example, blue light, green light, red light or yellow light) having a longer peak wavelength than UV light.

The supporter may include a polymer resin, a ceramic material such as glass, and the like. The phosphors may be randomly disposed on the supporter. For example, when the supporter is formed of an epoxy resin or an acryl resin, the first wavelength converter 120 may be provided by depositing a resin containing the phosphors on the first light emitting diode 110, followed by curing the resin.

Alternatively, the first wavelength converter 120 may include a single crystal material. The first wavelength converter 120 including the single crystal material may be provided in the form of a phosphor sheet, and such a phosphor-sheet type first wavelength converter 120 may be composed of single crystal phosphors. Light having passed through the first wavelength converter 120 including the single crystal phosphors may generally have constant color coordinates. For example, the single crystal phosphors may be single crystal of Cerium-doped yttrium aluminum garnet (YAG:Ce). Such a phosphor-sheet type first wavelength converter 120 may be bonded to the first light emitting diode 110.

The second light emitting unit 200 may be placed on the substrate 400 and separated from the first light emitting unit 100. The second light emitting unit 200 may include a second light emitting diode 210 and a second wavelength converter 220. The second light emitting diode 210 may include a light emitting structure 211, a third pad electrode 213 and a fourth pad electrode 215. The second light emitting unit 200 may be configured to emit light in a different wavelength band than the first light emitting unit 100. For example, the second light emitting unit 200 may emit amber light.

The light emitting structure 211, the third pad electrode 213 and the fourth pad electrode 215 of the second light emitting diode 210 are similar to the light emitting structure 111, the first pad electrode 113 and the second pad electrode 115 of the first light emitting diode 110. In the second light emitting diode 210, the third pad electrode 213 may be electrically connected to the third electrode 423 and the fourth pad electrode 215 may be electrically connected to the fourth electrode 433.

With this structure, the first light emitting diode 110 and the second light emitting diode 120 may be electrically connected to the separate electrodes 421, 431, 423, 433, the first light emitting unit 100 and the second light emitting unit 200 can be independently operated by providing separate power sources to the electrodes 421, 431, 423, 433. However, it should be understood that other implementations are also possible and that the electrodes 421, 431, 423, 433 may be electrically connected to each other. Furthermore, the light emitting device 10 may further include a separate controller (not shown) such that operation of the first light emitting unit 100 and the second light emitting unit 200 can be controlled by the controller.

Although the second wavelength converter 220 is generally similar to the first wavelength converter 120, the phosphors of the second wavelength converter 220 may be different from the phosphors of the first wavelength converter 120.

That is, since light emitted from the second light emitting unit 200 can pass through the second wavelength converter 220, the second wavelength converter 220 may include different types of phosphors than the phosphors of the first wavelength converter 120. Accordingly, when emitted from the second light emitting diode 210, light is excited while passing through the second wavelength converter 220 such that light having a peak wavelength in the amber light wavelength band can be emitted from the second light emitting unit 200.

In some exemplary embodiments, the second wavelength converter 220 may be free from phosphors. For example, when the wavelength band of light to be emitted from the second light emitting unit 200 is generally identical to the wavelength band of light to be emitted from the second light emitting diode 210, the phosphors can be omitted from the second wavelength converter 220. In this structure, the second wavelength converter 220 may include a light diffusing agent such as titanium dioxide ($TiO_2$).

Figure 5A:
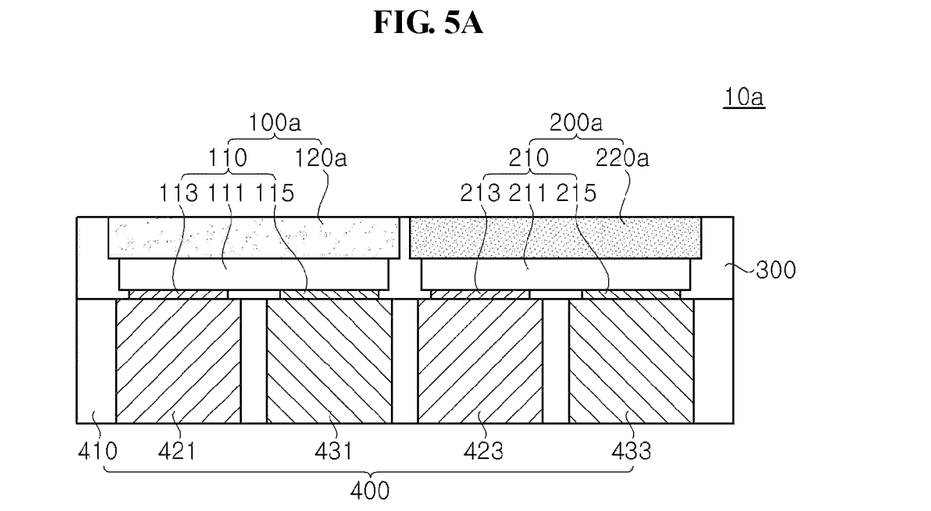
FIG. 5A and FIG. 5B are sectional views of light emitting devices according to other exemplary embodiments of the present disclosure.
Figure 5B:
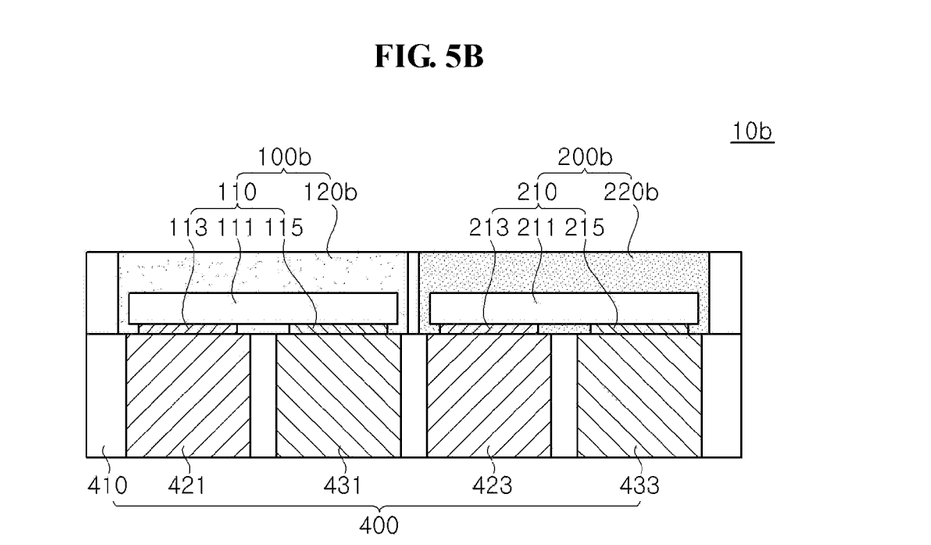

Alternatively, referring to FIG. 5A and FIG. 5B, the first and second wavelength converters 120, 220 may be formed in larger areas than the upper surfaces of the first and second light emitting diodes 110, 210, respectively, and may cover the side surfaces of the first and second light emitting diodes 110, 210.

Referring to FIG. 5A, in a light emitting diode 10a, first and second wavelength converters 120a, 220a may be formed in larger areas than the upper surfaces of the first and second light emitting diodes 110, 210. Accordingly, light can be emitted through relatively large areas of the first and second light emitting units 100a, 200a. In addition, referring to FIG. 5B, in a light emitting diode 10b, first and second wavelength converters 120b, 220b may be formed to cover the side surfaces of the first and second light emitting diodes 110, 210, respectively. Furthermore, the first and second wavelength converters 120b, 220b may further cover at least part of lower surfaces of the first and second light emitting diodes 110, 210, respectively. In this exemplary embodiment, the first and second wavelength converters 120b, 220b may surround side surfaces of the pad electrodes. In this structure, light emitted through the side surfaces of the light emitting diodes can directly enter the wavelength converters, thereby further improving wavelength conversion efficiency.

The sidewall 300 may cover the side surfaces of the first and second light emitting diodes 110, 210 and may further cover the side surfaces of the first and second wavelength converters 120, 220. The sidewall 300 may contact the first and second light emitting units 100, 200. In addition, part of the sidewall 300 may further cover part of the lower surfaces of the first and second light emitting diodes 110, 210, in which the side surfaces of the pad electrodes 113, 115, 213, 215 may be surrounded by the sidewall 300.

The sidewall 300 may support the first and second light emitting units 100, 200 and may protect the first and second light emitting units 100, 200 from an external environment. Furthermore, the sidewall 300 may serve to reflect light. With the structure wherein the sidewall 300 is formed along an outer periphery of the light emitting device 10, the light emitting device allows light emitted from the light emitting portions 100, 200 to be collected at an upper portion thereof. However, it should be understood that other implementations are also possible and that the beam angle of light emitted from the light emitting portions 100, 200 can be regulated by regulating reflectance or light transmittance of the sidewall 300, as needed.

The sidewall 300 may include an insulating polymer material or ceramic material, and may further include fillers capable of reflecting or scattering light. The sidewall 300 may have permeability, semi-permeability or reflectivity with respect to light. For example, the sidewall 300 may include a silicone resin, or a polymer resin such as an epoxy resin, a polyimide resin, a urethane resin, and the like. In this exemplary embodiment, the sidewall 300 may include a white silicone resin exhibiting light reflectivity.

The fillers may be evenly dispersed in the sidewall 300. The fillers may be selected from any materials capable of reflecting or scattering light without limitation, and may include, for example, titanium dioxide ($TiO_2$), silicon dioxide ($SiO_2$), zirconium dioxide ($ZrO_2$), and the like. The sidewall 300 may include at least one type of these fillers. Reflectivity or scattering capability of the sidewall 300 can be regulated by regulating the kind or concentration of the fillers.

An upper surface of the sidewall 300 may be flush with the upper surfaces of the first and second light emitting units 100, 200. That is, as shown in the drawings, the upper surface of the sidewall 300 may be flush with upper surfaces of the wavelength converters 120, 220.

Figure 1:
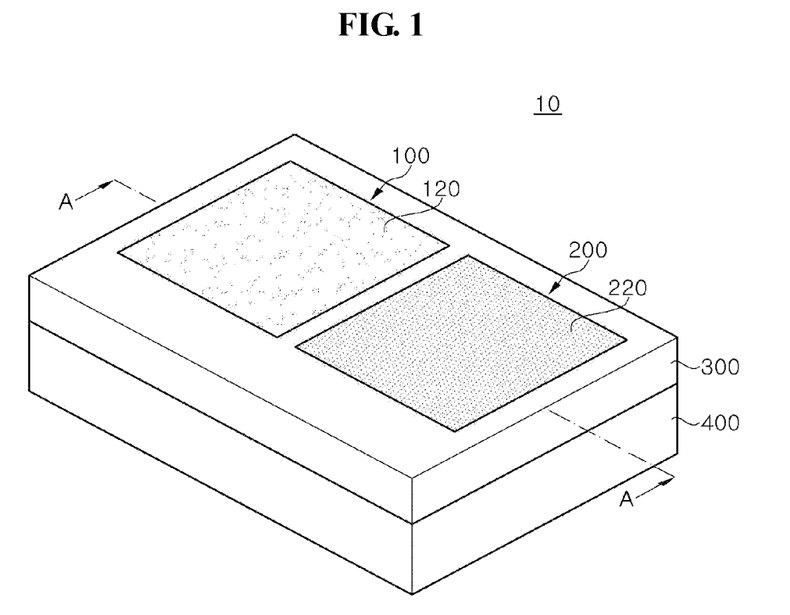
FIG. 1 is a perspective view of a light emitting device according to one exemplary embodiment of the present disclosure.
Figure 2:
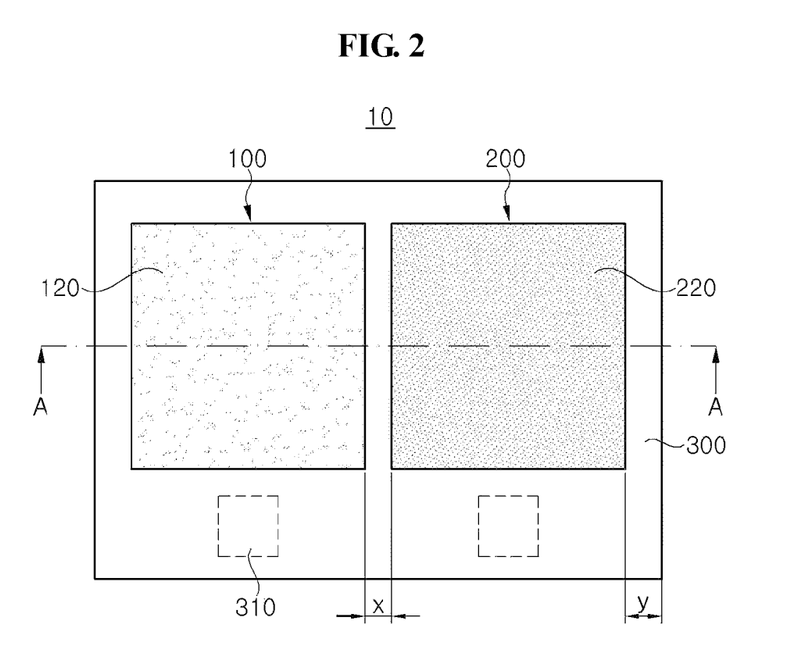
FIG. 2 is a top view of the light emitting device according to the exemplary embodiment of the present disclosure.
Figure 3:
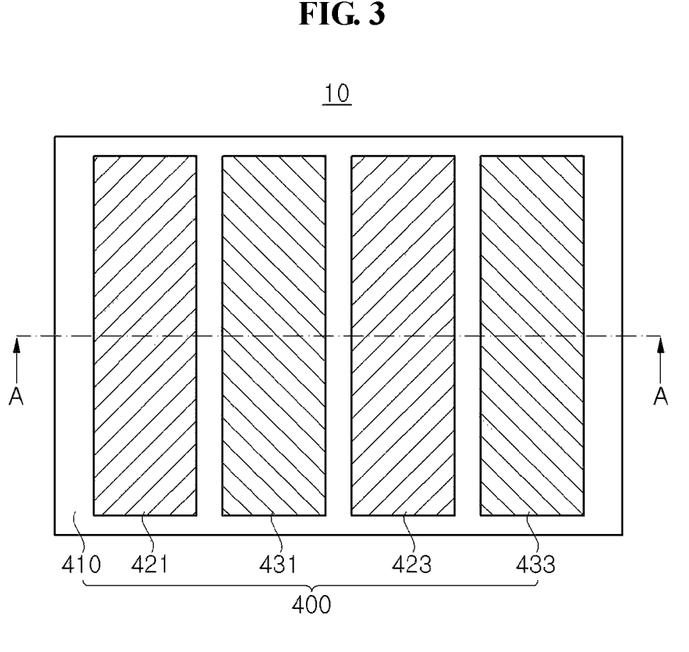
FIG. 3 is a bottom view of the light emitting device according to the exemplary embodiment of the present disclosure.

In addition, a portion of the sidewall 300 interposed between the first light emitting unit 100 and the second light emitting unit 200 may have a smaller thickness than an outer periphery thereof. That is, as shown in FIG. 2, thickness x of the portion of the sidewall 200 filling a separation space between the first light emitting unit 100 and the second light emitting unit 200 may be smaller than thickness y corresponding to the shortest distance from the outer periphery of the sidewall 300 to the side surface of one of the first and second light emitting units 100, 200. Accordingly, the separation distance between the first light emitting unit 100 and the second light emitting unit 200 can be minimized, thereby enabling further reduction in volume of the light emitting device 10 while more effectively protecting the first and second light emitting units 100, 200 from the external environment.

The light emitting device 10 according to these exemplary embodiments may further include a protection element 310. The protection element 310 may be disposed inside the sidewall 300 and may include, for example, a Zener diode. The protection element 310 may be electrically connected to at least one of the first and second light emitting diodes 110, 120 to prevent failure of the first and second light emitting diodes 110, 120 due to electrostatic discharge or the like. The protection element 310 may be separately connected to each of the first and second light emitting diodes 110, 120, or may be commonly connected thereto.

In the exemplary embodiments wherein the light emitting device 10 includes the protection element 310, the protection element 310 may be disposed to be biased to at least one side of the sidewall 300. For example, as shown in FIG. 2, the protection element 310 may be disposed inside the sidewall 300 to be biased to one side of the sidewall 300. Accordingly, the distance from one side of the sidewall 300, to which the protection element 310 is biased, to the light emitting portions 100, 200 may be greater than the distance from the other side of the sidewall 300 to the light emitting portions 100, 200. That is, the thickness of a portion of the sidewall 300 in which the protection element 310 is placed may be greater than the thickness of other portions thereof.

According to the exemplary embodiments described above, each of the light emitting devices 10, 10a, 10b includes the first light emitting unit 100 and the second light emitting unit 200 disposed on the substrate 400 to be separated from each other, in which the first and second light emitting units 100, 200 are electrically connected to different electrodes. With this structure, the first light emitting unit 100 and the second light emitting unit 200 can be independently driven, thereby allowing the light emitting device 10 to selectively emit different colors, as needed. Accordingly, it is possible to simplify the manufacturing process through omission of separate manufacture of two or more light emitting devices configured to emit different colors. Furthermore, since a plurality of colors can be emitted through a single light emitting device, it is possible to reduce a space occupied by the light emitting device in a specific application apparatus.

Figure 6:
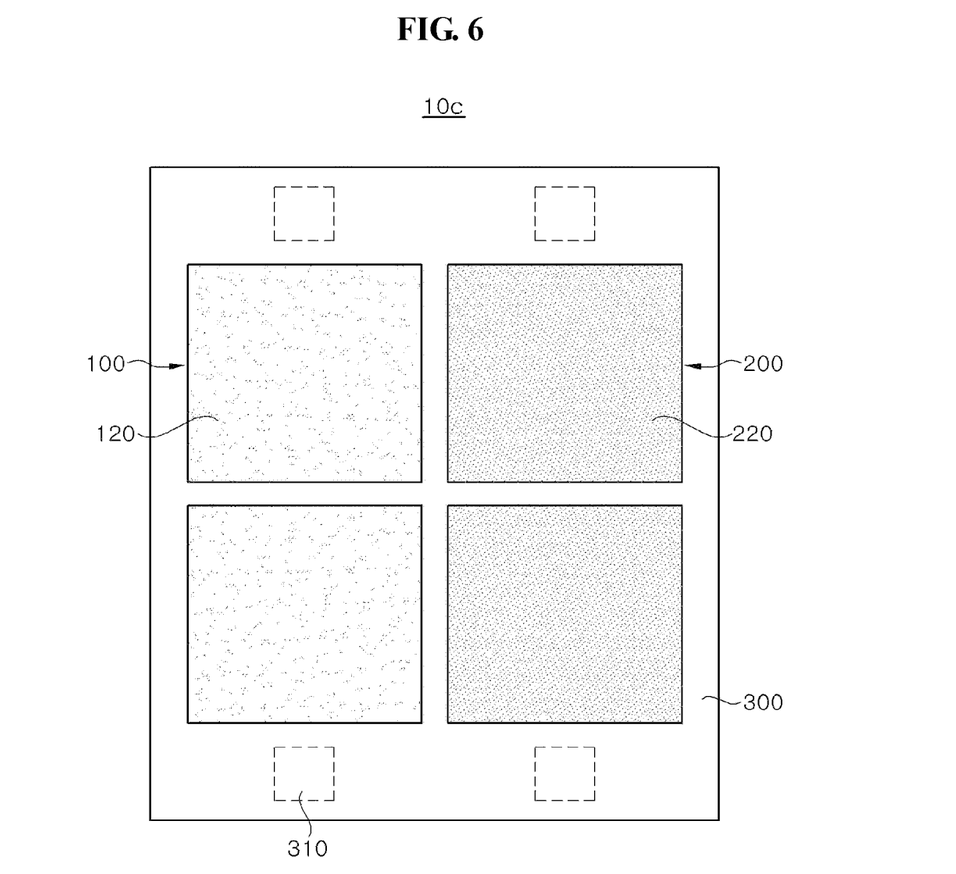
FIG. 6 is a top view of a light emitting device according to a further exemplary embodiment of the present disclosure.

In other exemplary embodiments, the light emitting device may include three or more light emitting portions. For example, referring to FIG. 6, a light emitting device 10c may include a plurality of first light emitting units 100 and a plurality of second light emitting units 200. The plurality of first light emitting units 100 may be connected in series or in parallel, and the plurality of second light emitting units 200 may also be connected in series or in parallel. As such, the light emitting device 10c includes three or more light emitting portions, thereby improving luminous intensity.

In some exemplary embodiments, the light emitting device may include light emitting portions configured to emit light of three or more colors.

Figure 7:
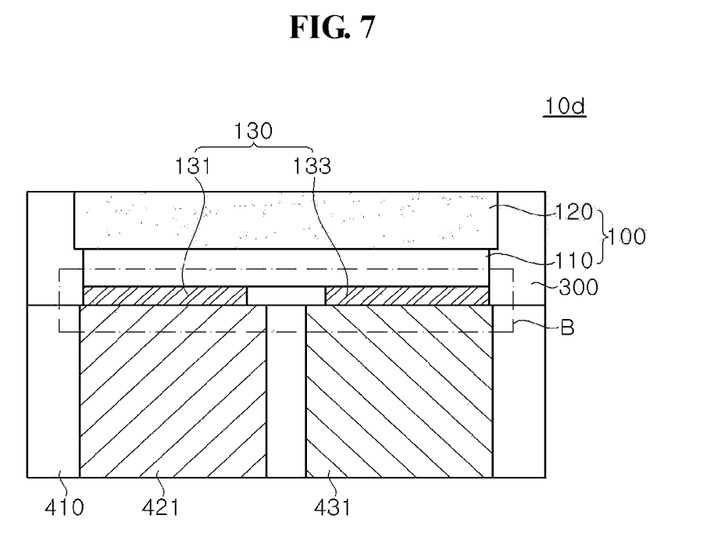
FIG. 7 is a cross-sectional view of a light emitting device according to one exemplary embodiment of the present disclosure.
Figure 8A:
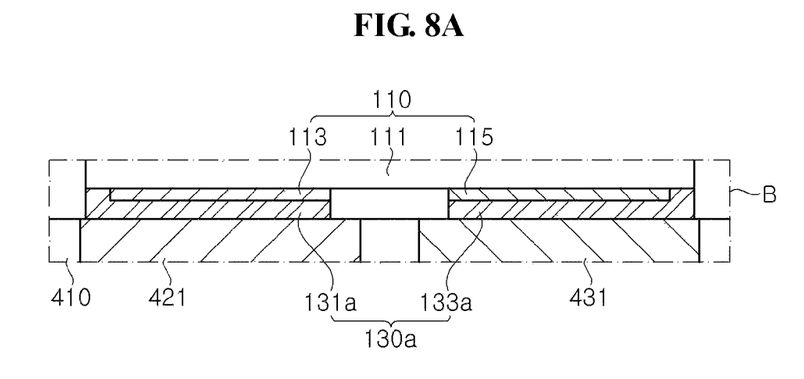
FIG. 8A and FIG. 8B are enlarged sectional views of bonding layers of light emitting devices according to exemplary embodiments of the present disclosure.
Figure 8B:
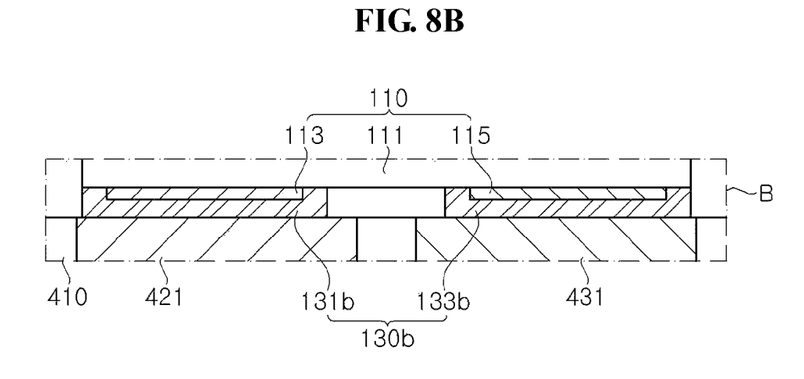
Figure 9:
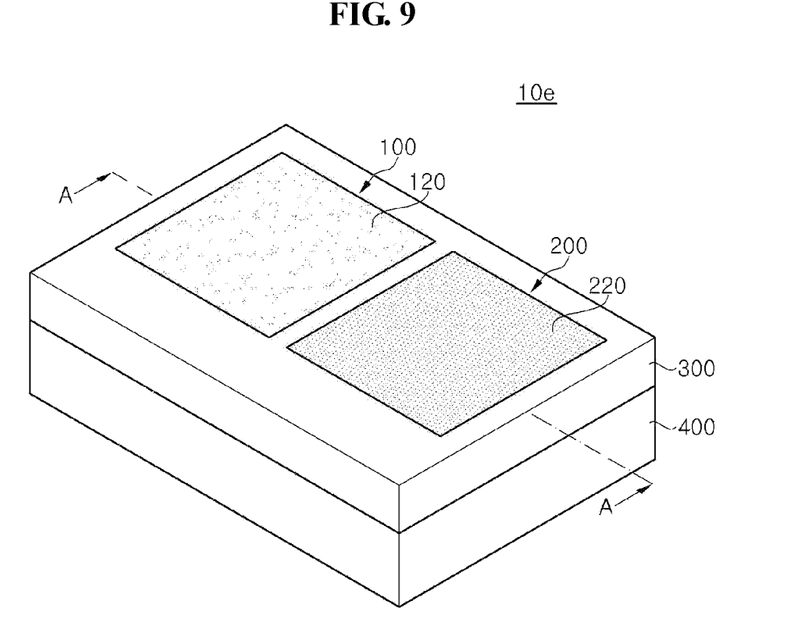
FIG. 9, FIG. 10, FIG. 11, and FIG. 12 are a perspective view, a plan view, a bottom view, and a cross-sectional view, respectively, of a light emitting device according to yet another exemplary embodiment of the present disclosure.
Figure 10:
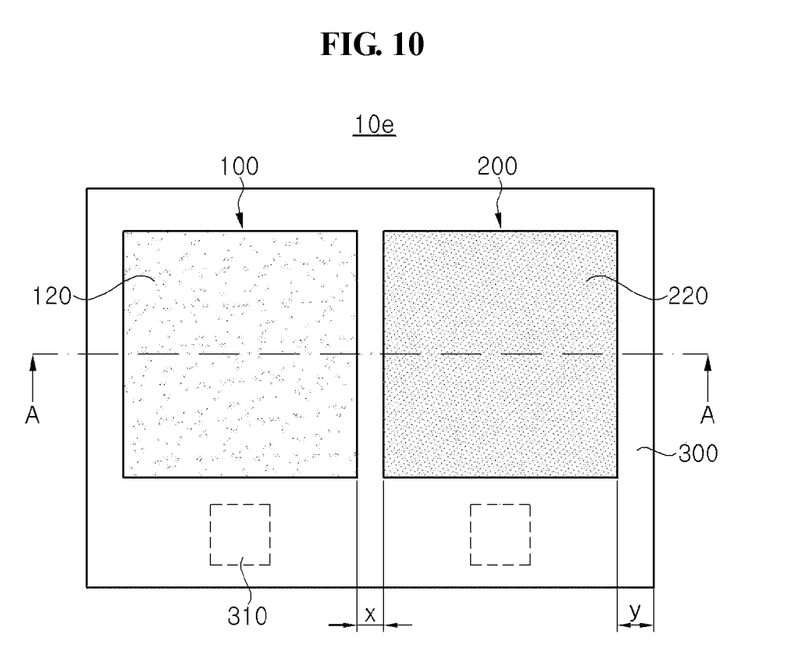
Figure 11:
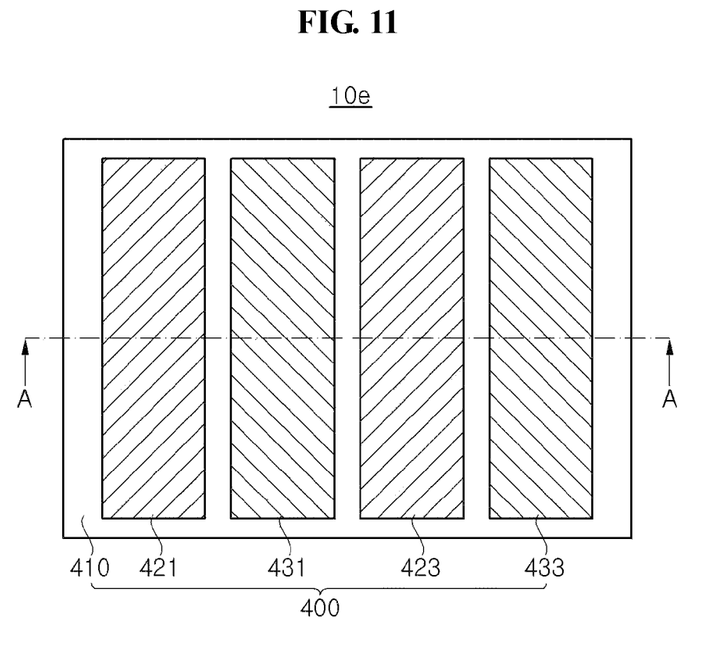
Figure 12:
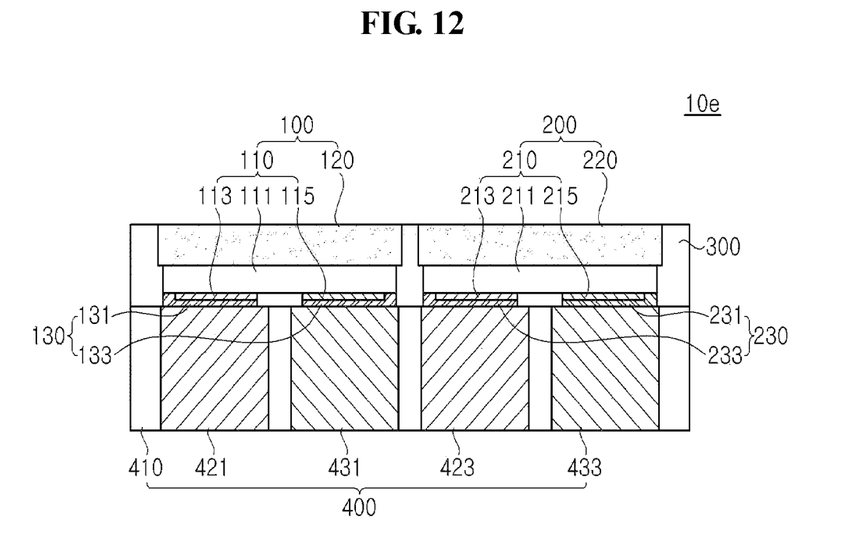

FIG. 7 is a cross-sectional view of a light emitting device according to one exemplary embodiment of the present disclosure, and FIG. 8A and FIG. 8B are cross-sectional views of bonding layers of light emitting devices according to exemplary embodiments of the present disclosure.

A light emitting device 10d according to this exemplary embodiment is generally similar to the first light emitting unit 100 of the light emitting device shown in FIG. 1 to FIG. 4 except that the light emitting device 10d according to this exemplary embodiment further includes a bonding layer 130. The following description will focus on different features of the light emitting device according to this exemplary embodiment and detailed descriptions of the same components will be omitted. Particularly, although the light emitting device 10d according to this exemplary embodiment includes a single light emitting portion, it should be understood that other implementations are also possible. The bonding layer 130 of the light emitting device according to this exemplary embodiment may also be applied to a light emitting device including a plurality of light emitting portions in a similar or identical manner.

First, referring to FIG. 7, the light emitting device 10d includes a first light emitting unit 100, which includes a light emitting diode 110 and a wavelength converter 120, a bonding layer 130, a sidewall 300, and a substrate 400. The light emitting device 10d may further include a protection element (not shown).

The light emitting diode 110 may be disposed on the substrate 400 and may include a light emitting structure 111. The light emitting diode 110 may further include a first pad electrode and a second pad electrode. The light emitting diode 110 may be mounted on the substrate 400 via the bonding layer 130. The light emitting diode 110 may be, for example, a flip-chip type semiconductor light emitting diode, in which pad electrodes are placed on one surface of the light emitting structure 111, without being limited thereto.

The bonding layer 130 may be interposed between the light emitting diode 110 and the substrate 400 to bond the light emitting diode 110 to the substrate 400 such that the light emitting diode 110 can be mounted thereon. Further, the bonding layer 130 may include a first bonding layer 131 and a second bonding layer 133.

The first and second bonding layers 131, 133 are separated and insulated from each other and may be electrically connected to different conductivity type semiconductor layers of the light emitting structure 111, respectively. In addition, the first and second bonding layers 131, 133 may be placed on a first electrode 421 and a second electrode 431 of the substrate 400 and may be electrically connected thereto, respectively.

The bonding layer 130 may include an electrically conductive material, particularly a metal sintered body. For example, the bonding layer 130 may include an Ag sintered body formed by sintering Ag particles. Such a bonding layer 130 may be formed by disposing a plurality of Ag sintered films in regions on the substrate 400 corresponding to regions in which the bonding layer 130 will be formed, disposing the light emitting diode 110 on the Ag sintered films, and curing the Ag sintered films under conditions of low temperature and pressure. As a result, the light emitting diode 110 can be bonded to the substrate 400 by the bonding layer 130.

The bonding layer 130 formed from the metal sintered films undergoes little variation in volume or location even when cured after the light emitting diode 110 is placed thereon. Accordingly, unlike typical pastes, it is possible to prevent electrical short circuit due to contact between the first bonding layer 131 and the second bonding layer 133 during mounting of the light emitting diode 110. In addition, since preliminarily prepared sintered films are provided in formation of the bonding layer, vacancies or pores are not created in the bonding layer 130 during mounting of the light emitting diode 110, thereby preventing deterioration in heat dissipation and mechanical strength of the bonding layer 130. Furthermore, since the thickness of the sintered film for the bonding layer 130 can be freely adjusted, it is possible to improve heat dissipation efficiency during operation of the light emitting diode 110 by increasing the thickness of the sintered film. For example, the bonding layer 130 may have a thickness of about 10 μm to 30 μm. With improved heat dissipation efficiency, the light emitting device according to the exemplary embodiment may be usefully provided to various application fields, for example, vehicular headlights, and the like, which require high output light emitting devices. Furthermore, since curing of the metal sintered film can be achieved at a relatively low pressure and a relatively low temperature, there is no concern about damage to the light emitting diode 110 due to high temperature or high pressure upon bonding of the light emitting diode 110 to the substrate 400.

The light emitting diode 110 may further include the first pad electrode 113 and the second pad electrode 115 formed on a lower surface of the light emitting structure 111, and the relationship between the light emitting diode 110, which includes include the first pad electrode 113 and the second pad electrode 115, and the bonding layer 130 will be described in more detail with reference to FIG. 8A and FIG. 8B.

The first pad electrode 113 and the second pad electrode 115 may be electrically connected to an n-type semiconductor layer and a p-type semiconductor layer (or vice versa), respectively. Particularly, the first pad electrode 113 and the second pad electrode 115 may be formed by extending the first pad electrode 113 and the second pad electrode 115 downwards from the lower surface of the light emitting structure 111 and thus may be placed at a lower side of the first light emitting diode 110. Alternatively, the first and second pad electrodes 113, 115 may be generally coplanar with the lower surface of the light emitting structure 111. Alternatively, the first and second pad electrodes 113, 115 may be placed higher than the lower surface of the light emitting structure 111. In this structure, the lower surface of the light emitting structure 111 may be formed with grooves, and the first and second pad electrodes 113, 115 may be exposed to the grooves.

The first and second pad electrodes 113, 115 may be electrically connected to the first electrode 421 and the second electrode 431 of the substrate 400. Here, the pad electrodes 113, 115 may be electrically connected to the electrodes 421, 431 by the bonding layer 130.

Specifically, referring to FIG. 8A, the first and second pad electrodes 113, 115 may adjoin the first bonding layer 131a and the second bonding layer 133a, respectively. The first bonding layer 131a may cover at least part of the first pad electrode 113. Particularly, the first bonding layer 131a may cover a lower surface and part of a side surface of the first pad electrode 113. Similarly, the second bonding layer 133a may cover at least part of the second pad electrode 115. Particularly, the second bonding layer 133a may cover a lower surface and part of a side surface of the second pad electrode 115.

More specifically, the first bonding layer 131a and the second bonding layer 133a may cover side surfaces of the first and second pad electrodes 113, 115 excluding side surfaces of the first and second pad electrodes 113, 115 facing the second and first pad electrodes 115, 113, respectively. That is, as shown in the drawings, one side surface of the first bonding layer 131a may be flush with the side surface of the first pad electrode 113 facing the second pad electrode 115 instead of covering the side surface thereof. Likewise, one side surface of the second bonding layer 133a may be flush with the side surface of the second pad electrode 115 facing the first pad electrode 113. Furthermore, other side surfaces of the first bonding layer 131a excluding the one side surface thereof may be flush with the side surfaces of the light emitting diode 110 and the other side surfaces of the second bonding layer 133a excluding the one side surface thereof may be flush with the side surfaces of the light emitting diode 110.

A bonding layer 130a is not present in a separation region between the first pad electrode 113 and the second pad electrode 115, thereby preventing electrical short circuit upon mounting of the light emitting diode 110.

In addition, as shown in FIG. 8B, a bonding layer 130b may be formed to cover the lower and side surfaces of the first and second pad electrodes 113, 115. In this exemplary embodiment, the bonding layer 130b may have a large horizontal cross-sectional area, thereby improving heat dissipation efficiency during operation of the light emitting device 10.

In this exemplary embodiment, the sidewall 300 may at least partially adjoin the bonding layer 130. Particularly, the bonding layer 130 extends to the side surfaces of the light emitting diode 110, and when the bonding layer 130 has a slope, an interface between the sidewall 300 and the side surface of the bonding layer 130 may also be slanted. With this structure, luminous efficacy of the light emitting device 10 can be further improved. However, it should be understood that other implementations are also possible and that the beam angle of light emitted from the light emitting portion 100 can be regulated by regulating reflectance or light transmittance of the sidewall 300, as needed.

The bonding layer 130 according to the exemplary embodiment described above may be applied to the light emitting device shown in FIG. 1 to FIG. 4. For example, FIG. 9 to FIG. 12 are a perspective view, a plan view, a bottom view and a cross-sectional view of a light emitting device according to yet another exemplary embodiment of the present disclosure.

A light emitting device 10e described with reference to FIG. 9 to FIG. 12 is distinguished from the light emitting device 10 described with reference to FIG. 1 to FIG. 4 except that the light emitting device 10e further includes bonding layers 130, 230. The following description will focus on different features of the light emitting device 10e and detailed descriptions of the same components will be omitted.

Referring to FIG. 9 to FIG. 12, the light emitting device 10e may include at least two light emitting portions. Specifically, the light emitting device 10e may include a first light emitting unit 100, a second light emitting unit 200, a first bonding layer 130, a second bonding layer 230, a sidewall 300, and a substrate 400. The light emitting device 10e may further include a protection element 310.

The first light emitting unit 100 may include a light emitting structure 111, a first pad electrode 113 and a second pad electrode 115, and the second light emitting unit 200 may include a light emitting structure 211, a third pad electrode 213 and a fourth pad electrode 215. The first bonding layer 130 may be interposed between the first light emitting unit 100 and the substrate 400 to bond the first light emitting unit 100 to the substrate 400. The second bonding layer 230 may be interposed between the second light emitting unit 200 and the substrate 400 to bond the second light emitting unit 200 to the substrate 400. The first and second bonding layers 130, 230 may include a metal sintered body formed by sintering metal particles, particularly an Ag sintered body formed by sintering Ag particles.

According to the exemplary embodiments described above, each of the light emitting devices 10, 10a, 10b, 10c, 10d, 10e includes at least two light emitting portions separated from each other on the substrate 400. For example, each of the light emitting devices 10, 10a, 10b, 10c, 10d, 10e includes the first light emitting unit 100 and the second light emitting unit 200, which are electrically connected to different electrodes. Accordingly, the first light emitting unit 100 and the second light emitting unit 200 can be independently driven, thereby allowing the light emitting device to selectively emit different colors, as needed. Accordingly, it is possible to simplify the manufacturing process through omission of separate manufacture of two or more light emitting devices configured to emit different colors. Furthermore, since a plurality of colors can be emitted through a single light emitting device, it is possible to reduce a space occupied by the light emitting device in a specific application apparatus.

In other exemplary embodiments, the light emitting device may include three or more light emitting portions. For example, the light emitting device may include first to third light emitting portions, which are configured to emit light having different color coordinates. Among the plurality of light emitting portions, at least two light emitting portions may be configured to emit light having the same color coordinates.

Each of the light emitting devices according to the exemplary embodiments described above may emit light of two or more colors. Such light emitting devices may be applied to an application device required to emit a plurality of colors, for example, a vehicular lamp. Next, a vehicular lamp including the light emitting device according to the exemplary embodiments of the present disclosure will be described with reference to FIG. 13.

Figure 13:
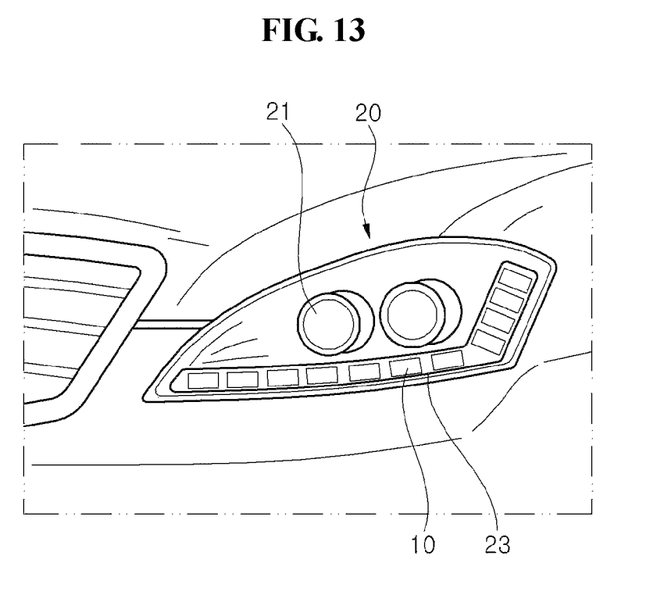
FIG. 13 is a front view of a vehicular lamp according to yet another exemplary embodiment of the present disclosure.

FIG. 13 is a front view of a vehicular lamp according to yet another exemplary embodiment of the present disclosure.

Referring to FIG. 13, a vehicular lamp 20 according to this exemplary embodiment may include a combination lamp 23 and may further include a main lamp 21. The vehicular lamp 20 may be applied to various parts of vehicles, such as headlights, rear lamps, side lamps, and the like.

The main lamp 21 may be a main lighting fixture of the vehicular lamp 20. For example, when the vehicular lamp 20 is used as a headlight, the main lamp 21 acts as a headlamp illuminating the area in front of a vehicle.

The combination lamp 23 may include the light emitting device 10 according to the exemplary embodiments described above. The light emitting device 10 may include at least one of the light emitting devices 10, 10a, 10b, 10c, 10d, 10e according to the exemplary embodiments described above. The combination lamp 23 may have at least two functions. For example, when the vehicular lamp 20 is used as the headlight, the combination lamp 23 may act as a daytime running light (DRL) and as a turn signal light.

Specifically, in a vehicle including the vehicular lamp 20 according to this exemplary embodiment, the light emitting device 10 of the combination lamp 23 allows white light to be emitted from the first light emitting unit 100 thereof during driving of the vehicle. As a result, the combination lamp 23 can act as the daytime running light by emitting white light. In addition, when a turn signal light of the vehicle is turned on, the light emitting device 10 of the combination lamp 23 turns off the first light emitting unit 100 and allows the second light emitting unit 200 to emit amber light. As a result, the combination lamp 23 can act as the turn signal light by emitting amber light. Operation of the combination lamp 23 and the light emitting device 10 may be controlled by a separate controller (not shown).

In this way, as a light source of the combination lamp 22 capable of providing at least two functions by emitting light of two or more colors, the light emitting device 10 according to the exemplary embodiments may be used. Since the light emitting device 10 according to the exemplary embodiments includes light emitting portions configured to emit light having at least two different wavelengths, it is possible to omit a process of mounting two or more separate light emitting devices in manufacture of the vehicular lamp 20 including the combination lamp 23. Accordingly, the exemplary embodiments of the present disclosure can reduce defect rate of the vehicular lamp 20 and can improve process yield through simplification of the manufacturing process. Furthermore, since the light emitting device 10 has a relatively small volume, it is possible to reduce a spatial limit in manufacture of the combination lamp 23 and to facilitate various modifications and changes of the combination lamp 23.

Although some exemplary embodiments have been described herein, it should be understood that these embodiments are provided for illustration only and are not to be construed in any way as limiting the present disclosure, and that various modifications, changes, alterations, and equivalent embodiments can be made by those skilled in the art without departing from the spirit and scope of the present disclosure.

What is claimed is:

1. A light emitting device comprising:
   a substrate comprising a base surrounding a first electrode, a second electrode, a third electrode, and a fourth electrodes;
   a first light emitting unit disposed on the substrate, the first light emitting unit comprising:
   a first light emitting diode; and
   a first wavelength converter disposed on the first light emitting diode;
   a second light emitting unit disposed on the substrate to be separated from the first light emitting unit, the second light emitting unit comprising:
   a second light emitting diode; and
   a second wavelength converter disposed on the second light emitting diode; and
   a sidewall disposed surrounding side surfaces of the first light emitting unit and the second light emitting unit and between the first light emitting unit and the second light emitting unit,
   wherein a first separation distance between the first light emitting diode and the second light emitting diode is different from a second separation distance between the first and second wavelength converters,
   wherein the sidewall comprises a light reflective material,
   wherein a side surface of the sidewall is flush with a side surface of the substrate, and
   wherein an upper surface of the sidewall is flush with each upper surfaces of the first light emitting unit and the second light emitting unit.

2. The light emitting device according to claim 1, wherein the first electrode and the second electrode are electrically connected to the first light emitting unit, and the third electrode and the fourth electrode are electrically connected to the second light emitting unit.

3. The light emitting device according to claim 2, wherein the first, second, third, and fourth electrodes are insulated from each other, and each of the first, second, third, and fourth electrodes is exposed to an outer surface of the substrate.

4. The light emitting device according to claim 1, wherein the substrate comprises at least one of a polymer material and a ceramic material.

5. The light emitting device according to claim 1, wherein the first light emitting unit and the second light emitting unit are configured to emit light having different peak wavelengths.

6. The light emitting device according to claim 5, wherein the first light emitting unit emits white light and the second light emitting unit emits amber light.

7. The light emitting device according to claim 1, wherein each of the first light emitting diode and the second light emitting diode comprises pad electrodes disposed on a lower surface thereof.

8. The light emitting device according to claim 7, wherein the sidewall surrounds at least a part of the lower surface of each of the first and second light emitting diodes and at least a part of the side surfaces of the pad electrodes.

9. The light emitting device according to claim 1, wherein each of the first light emitting unit and the second light emitting unit is formed in plural.

10. The light emitting device according to claim 1, wherein a first thickness of a portion of the sidewall interposed between the first light emitting unit and the second light emitting unit is smaller than a second thickness of a portion of the sidewall corresponding to the shortest distance from an outer peripheral surface of the sidewall to a side surface of one of the first light emitting unit and the second light emitting unit.

11. The light emitting device of claim 1, wherein the first separation distance is lager than the second separation distance.

12. The light emitting device of claim 1, wherein the first wavelength converter and the second wavelength converter have larger surface areas in plan view than the upper surfaces of the first and second light emitting diodes.

13. A light emitting device comprising:
   a substrate comprising a first electrode, a second electrode, a third electrode, and a fourth electrode;
   a first light emitting unit disposed on the substrate, the first light emitting unit comprising:
   a first light emitting diode; and
   a first wavelength converter disposed on the first light emitting diode;
   a second light emitting unit disposed on the substrate to be separated from the first light emitting unit, the second light emitting unit comprising:
   a second light emitting diode; and
   a second wavelength converter disposed on the second light emitting diode; and
   a sidewall disposed surrounding side surfaces of the first light emitting unit and the second light emitting unit, the sidewall comprising a light reflective material,
   wherein a first portion of the sidewall filling a separation between the first light emitting diode and the second light emitting diode is thicker than a second portion of the sidewall filling a separation between the first wavelength converter and the second wavelength converter,
   wherein a side surface of the sidewall is flush with a side surface of the substrate, and
   wherein an upper surface of the sidewall is flush with each upper surfaces of the first light emitting unit and the second light emitting unit.

14. The light emitting device of claim 13, wherein the first electrode, a second electrode, a third electrode, and fourth electrode formed vertically through the substrate to be exposed to an upper surface and a lower surface of the substrate.

15. The light emitting device of claim 14, further comprising;
a first bonding layer interposed between the first light emitting unit and the substrate;
a second bonding layer interposed between the second light emitting unit and the substrate.

16. The light emitting device of claim 15, wherein the first electrode and the second electrode are electrically connected to the first light emitting unit, and the third electrode and the fourth electrode are electrically connected to the second light emitting unit.

17. The light emitting device of claim 16, wherein the substrate having a base to insulate the first, second, third, and fourth electrodes and the side of base is coplanar with the side of the sidewall.

18. The light emitting device of claim 13, wherein a thickness of a third portion of the sidewall corresponding to the shortest distance from an outer peripheral surface of the sidewall to a side surface of one of the first and second wavelength converters is different from a thickness of the first portion of the sidewall.

19. The light emitting device of claim 18, wherein the thickness of the first portion of the sidewall is smaller than the thickness of the third portion of the sidewall.

20. The light emitting device of claim 15, wherein the sidewall directly contacts both of the first wavelength converter and the second wavelength converter.

* * * * *